(12) United States Patent
Aulnette et al.

(10) Patent No.: US 11,430,910 B2
(45) Date of Patent: Aug. 30, 2022

(54) ENGINEERED SUBSTRATE

(71) Applicant: Soitec, Bernin (FR)

(72) Inventors: Cécile Aulnette, Lumbin (FR); Frank Dimroth, Gundelfingen Wildtal (DE); Eduard Oliva, Freiburg (DE)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 16/074,348

(22) PCT Filed: Feb. 1, 2017

(86) PCT No.: PCT/EP2017/052080
§ 371 (c)(1),
(2) Date: Jul. 31, 2018

(87) PCT Pub. No.: WO2017/134064
PCT Pub. Date: Aug. 10, 2017

(65) Prior Publication Data
US 2019/0355867 A1    Nov. 21, 2019

(30) Foreign Application Priority Data
Feb. 3, 2016   (FR) ...................................... 1650861

(51) Int. Cl.
*H01L 31/044* (2014.01)
*H01L 31/18* (2006.01)
(Continued)

(52) U.S. Cl.
CPC .... *H01L 31/1896* (2013.01); *H01L 31/02008* (2013.01); *H01L 31/056* (2014.12); *H01L 31/0735* (2013.01); *H01L 31/1844* (2013.01)

(58) Field of Classification Search
CPC ................ H01L 31/00–078; Y02E 10/50–60
(Continued)

(56) References Cited

U.S. PATENT DOCUMENTS 4,292,461 A      9/1981 Hovel
2012/0085400 A1* 4/2012 Arena et al. ............ H01L 31/00
                                                                136/255
(Continued)

FOREIGN PATENT DOCUMENTS

CN      102257642 B     12/2013
CN      104576776    *  4/2015    ......... H01L 31/0224
(Continued)

OTHER PUBLICATIONS

CN104576776 English Translation, Ma et al. (Year: 2015).*
(Continued)

*Primary Examiner* — Bach T Dinh
(74) *Attorney, Agent, or Firm* — TraskBritt

(57) ABSTRACT

An engineered substrate comprises: a seed layer made of a first semiconductor material for growth of a solar cell; a support substrate comprising a base and a surface layer epitaxially grown on a first side of the base, the base and the surface layer made of a second semiconductor material; a direct bonding interface between the seed layer and the surface layer; wherein a doping concentration of the surface layer is higher than a predetermined value such that the electrical resistivity at the direct bonding interface is below 10 mOhm·cm², preferably below 1 mOhm·cm²; and wherein a doping concentration of the base as well as the thickness of the engineered substrate are such that absorption of the engineered substrate is less than 20%, preferably less than 10%, and total area-normalized series resistance of the engineered substrate is less than 10 mOhm·cm², preferably less than 1 mOhm·cm².

19 Claims, 2 Drawing Sheets

(51) Int. Cl.
*H01L 31/056* (2014.01)
*H01L 31/02* (2006.01)
*H01L 31/0735* (2012.01)

(58) Field of Classification Search
USPC .................................................. 136/243–265
See application file for complete search history.

(56) References Cited

U.S. PATENT DOCUMENTS

| | | | | |
|---|---|---|---|---|
| 2012/0138116 | A1* | 6/2012 | Bhusari et al. | H01L 31/00 136/244 |
| 2015/0380592 | A1 | 12/2015 | Newman et al. | |
| 2016/0043269 | A1* | 2/2016 | Lagoutte et al. | H01L 31/1892 136/244 |

FOREIGN PATENT DOCUMENTS

| | | | | |
|---|---|---|---|---|
| CN | 104779211 A | | 7/2015 | |
| CN | 104993005 | * | 10/2015 | ......... H01L 31/0725 |
| EP | 2645429 A1 | | 10/2013 | |
| JP | 57-013778 A | | 1/1982 | |
| JP | 09-008339 A | | 1/1997 | |
| JP | 2011-103356 A | | 5/2011 | |
| JP | 2014-504002 A | | 2/2014 | |
| WO | 2013143851 A1 | | 10/2013 | |
| WO | WO2013143854 | * | 10/2013 | |
| WO | WO2014154993 | * | 10/2014 | ............ H01L 31/18 |

OTHER PUBLICATIONS

CN104993005 English Translation, Gang et al. (Year: 2015).*
Japanese Notice of Reasons for Rejections for Japanese Application No. 2018-536807 dated Aug. 6, 2019, 3 pages.
Essig et al., "Wafer-Bonded GaInP/GaAs//Si Solar Cells With 30% Efficiency Under Concentrated Sunlight" IEEE J. of Photovoltaics, vol. 5, No. 3, (Feb. 19, 2015), pp. 224-228.
Japanese Search Report for Japanese Application No. 2018-536807, dated Jul. 31, 2019, 21 pages with English Translation.
Japanese Written Opinion for Japanese Application No. 2018-536807, dated Nov. 6, 2019, 6 pages with English Translation.
French Search Report for French Application No. 1650861 dated Jan. 9, 2017, 3 pages.
Griggs et al., Design Approaches and Materials Processes for Ultrahigh Efficiency Lattice Mismatched Multi-Junction Solar Cells, Conference Record of the 2006 IEEE 4the World Conference on Photovoltaic Energy Conversion, (May 1, 2006), pp. 857-860.
International Search Report for International Application No. PCT/EP2017/052080 dated Apr. 24, 2017, 4 pages.
International Written Opinion for International Application No. PCT/EP2017/052080 dated Apr. 24, 2017, 8 pages.
Sharps et al., Wafer Bonding for use in Mechanically Stacked Multi-Bandgap Cells, Conference Record of the 26th IEEE Photovoltaic Specialists Conferenct, (Oct. 3, 1997), pp. 895-898.
Japanese Final Rejection for Japanese Application No. 2018-536807, dated Apr. 14, 2020, 6 pages with English translation.
Chinese First Notification of Office Action for Application No. 201780009189.2 dated Apr. 29, 2022, 12 pages.

* cited by examiner

ENGINEERED SUBSTRATE

CROSS-REFERENCE TO RELATED APPLICATIONS

This application is a national phase entry under 35 U.S.C. § 371 of International Patent Application PCT/EP2017/052080, filed Feb. 1, 2017, designating the United States of America and published in English as International Patent Publication WO 2017/134064 A1 on Aug. 10, 2017, which claims the benefit under Article 8 of the Patent Cooperation Treaty to French Patent Application Serial No. 1650861, filed Feb. 3, 2016.

TECHNICAL FIELD

This application relates to an engineered substrate as well as a method of manufacturing an engineered substrate.

BACKGROUND

Photovoltaic or solar cells are designed for converting the solar radiation to electrical current. In concentrator solar photovoltaic applications, the incoming sun light is optically concentrated before it is directed to solar cells. For example, the incoming sun light is received by a primary mirror that reflects the received radiation toward a secondary mirror that, in turn, reflects the radiation toward a solar cell, which converts the concentrated radiation to electrical current by the generation of electron-hole pairs in III-V semiconductor or single crystal silicon, for example. Concentrator photovoltaics may, alternatively or additionally, comprise Fresnel lens optics for the concentration of the incoming solar radiation.

Since different semiconductor material composition show optimal absorption for different wavelengths of the incoming solar radiation, MJ (multijunction) cells have been proposed that comprise, for example, three cells showing optimal absorption in different wavelength ranges.

Recently, in the field of optoelectronics application, e.g., CPV (concentrator photovoltaic) cells, IR (infrared) detectors, etc., interest has focused on recycling photons, reducing losses of photons and reducing resistivity.

One of the problems connected with these issues is the efficiency of the cell. For instance, commonly used substrates such as GaAs substrates need to be doped to ensure a low contact resistance. But this doping is inducing increased absorption of photons.

WO 2013/143851 discloses a process of manufacturing MJ solar cell devices, including a transfer of a seed layer on a final substrate.

For MJ (multijunction) solar cells or, more generally, "photodetectors," e.g., suitable for a fabrication method of the MJ solar cell as set forth in WO 2013/143851 that implies direct bonding of at least two subcells, i.e., each of which is grown on a substrate, however, both substrates having different lattice constants, there is a need for proper substrates to increase efficiency of the solar cell based on such substrates.

In view of the above-mentioned problems, it is an object of the present disclosure to provide a sufficiently transparent, yet electrically conductive, substrate with improved efficiency for MJ solar cells.

BRIEF SUMMARY

The present disclosure addresses the above-mentioned need and, accordingly, the disclosure comprises:

An engineered substrate comprising: a seed layer made of a first semiconductor material for growth of a solar cell; a support substrate comprising a base and a surface layer epitaxially grown on the base, the base and the surface layer being made of a second semiconductor material; a direct bonding interface between the seed layer and the surface layer; wherein doping concentration of the surface layer is higher than a predetermined value such that the electrical resistivity at the direct bonding interface is below 10 mOhm·cm$^2$, preferentially below 1 mOhm·cm$^2$; and wherein doping concentration of the base as well as the thickness of the engineered substrate are such that the absorption of the engineered substrate is less than 20%, preferentially less than 10%, and total area-normalized series resistance of the engineered substrate is less than 10 mOhm·cm$^2$, preferentially less than 5 mOhm·cm$^2$.

In the above provided engineered substrate, the term "base" is short for "base substrate" and both terms are used synonymously. The base and the surface layer form the support substrate, which may also be termed a "support layer." The support substrate may also be termed a "receiver substrate." The base corresponds to a low doped bottom part that is suitable for low absorption and providing at the same time sufficient mechanical stability for handling of the substrate. The top part of the support substrate corresponds to the surface layer. The surface layer is formed by epitaxial growth of a highly doped, i.e., heteroepitaxial, layer on the base layer. A low interfacial resistance with the seed layer can thereby be guaranteed, e.g., InP seed layer on GaAs surface layer formed on base substrate of GaAs or Ge.

For the above-mentioned engineered substrate, the substrate is composed of two non-lattice matched materials, e.g., InP for the top thin layer, i.e., the seed layer, and GaAs or Ge for the bottom receiver substrate, i.e., the support substrate. The thin layer of seed layer of a first material can be obtained by several approaches including bonding on the second material, both of which are preferentially both highly doped at the bonding interface in order to ensure low interface resistivity.

The absorption being less than 20% should be understood as the engineered substrate should only absorb less than 20% of the incident light, whereas more than 80% of the incident light should be transmitted through the engineered substrate.

The electrical resistivity is an intrinsic property that quantifies how strongly a given material opposes the flow of electric current. A low resistivity indicates a material that readily allows the movement of electric charge. Resistivity is commonly represented by the Greek letter ρ (rho). The unit of electrical resistivity derives from the product of the resistance R with the surface area or cross-sectional area A of the solar cell or the engineered substrate, respectively. As a formula, this is R·A=rho·l, where l represents the length or thickness, which is substantially perpendicular to the area A. The unit of electrical resistivity thus is ohmmeter (Ω·m) although other units like ohm-centimeter (Ω·cm) may derive from this.

The series resistance represents one of the major resistive effects in a solar cell. A high series resistance may reduce the fill factor and thereby ultimately the efficiency of the solar cell. In order to make values comparable, the values are area-normalized so as to multiply the resistance with an area, which is the same as using the current density instead of the current in Ohm's law, thereby obtaining a unit of Ohm·cm$^2$.

The engineered substrate may further comprise a back side metal contact serving as a mirror provided on a second side of the base opposite to the first side.

The back side metal contact may serve as a back side mirror. Typically, it is placed right below the base in order to prevent or at least minimize losses of photons by reflecting them back toward the base and further at least partially to the active layers of the solar cell. Photons may thus be recycled by the mirror and the loss of photons is reduced. The above-mentioned area-normalized series resistance of the engineered substrate has the further effect of providing electrical connection of the cell to the back side metal contact to collect the generated electrons. The back side metal contact is typically provided under the base, i.e., on a second side of the base opposite to the first side of the base. In other words, one side or one surface of the base has the surface layer provided thereon, whereas the other free side or surface of the base may have the back side metal contact thereon.

For the engineered substrate, the predetermined value may typically be $10^{18}$ atoms/cm$^3$.

The predetermined value of doping concentration of $10^{18}$ atoms/cm$^3$ provides the interface having a low resistivity.

In the engineered substrate, the seed layer may also have a doping concentration higher than the predetermined value.

Also, for the seed layer, the predetermined valued of doping concentration of $10^{18}$ atoms/cm$^3$ provides for the interface having a low resistivity.

In the engineered substrate, the thickness of the seed layer and/or the surface layer may be in a range of 150 nm up to 1 µm.

In the engineered substrate, the thickness of the base may range from 100 µm up to 500 µm and the doping concentration of the base may range from $1\times10^{14}$-$5\times10^{17}$ atoms/cm$^3$.

In the engineered substrate, the first semiconductor material may have a lattice constant in the range of 5.8-6 Å (0.58 nm-0.6 nm).

These values typically correspond to the lattice constant of InP. The support substrate typically is the final substrate. For the case of directly bonded MJ cells, the subcell grown on this substrate should have the lowest energy gaps, which is only possible to achieve with materials having lattice constants around the lattice constant of InP.

In the engineered substrate, the first semiconductor material may be InP or the first semiconductor material may be a ternary or quaternary or penternary III-V material, for example, InGaAs or InGaAsP, and the second semiconductor material may be GaAs or Ge.

The disclosure further provides a solar cell comprising an engineered substrate as described above.

The disclosure further provides a method of manufacturing an engineered substrate comprising the steps of providing a first substrate; providing a seed layer on the first substrate, the seed layer made of a first semiconductor material, providing a base; forming, by epitaxial growth, a surface layer on a first side of the base, the base and the surface layer made of a second semiconductor material; directly bonding the seed layer to the surface layer, thereby providing a direct bonding interface, and then removing the first substrate; wherein doping concentration of the surface layer is higher than a predetermined value such that the electrical resistivity at the direct bonding interface is below 10 mOhm·cm$^2$, preferentially below 1 mOhm·cm$^2$; and wherein doping concentration of the base as well as the thickness of the engineered substrate are such that both absorption of the engineered substrate is less than 20%, preferentially less than 10%, as well as total area-normalized series resistance of the engineered substrate is less than 10 mOhm·cm$^2$, preferentially less than 5 mOhm·cm$^2$.

The engineered substrate as detailed above may be used for the manufacturing of CPV cells, MJ cells or any light detection devices.

The method of manufacturing an engineered substrate may further comprise the step of providing a back side metal contact on a second side of the base opposite to the first side, serving as a mirror.

The mirror may also be formed after formation of the MJ cell.

The method of manufacturing an engineered substrate may further comprise an ion implantation step for creating an implantation layer in a part of the first substrate and/or the seed layer before directly bonding the seed layer to the surface layer.

The back side mirror is arranged right below the base to prevent losses by reflecting photons back to the base and further toward the active layers of the solar cell. The base comprises a low doped bottom part suitable for low absorption, providing mechanical stability for handling, and electrical conductivity high enough to provide electrical connection of the cell to the back side metal contact for collecting the generated electrons. The latter serves as a mirror as pointed out previously. The top part of the receiver substrate is formed by epitaxial growth of a highly doped, i.e., heteroepitaxial layer necessary in order to guarantee a low interfacial resistance with the epitaxial seed layer, e.g., InP seed layer on GaAs top layer formed on bottom GaAs or Ge substrate.

The engineered substrate disclosed can be used for the fabrication of CPV cells or any light detection devices.

The engineered substrate is composed of two non-lattice matched materials, e.g., InP for the top thin layer, and GaAs or Ge for the bottom receiver substrate. The thin layer of epitaxial seed layer of a first material can be obtained by several approaches including bonding on the second material, both of which need to be highly doped at the bonding interface in order to ensure low interface resistivity.

DETAILED DESCRIPTION

Figure 1:
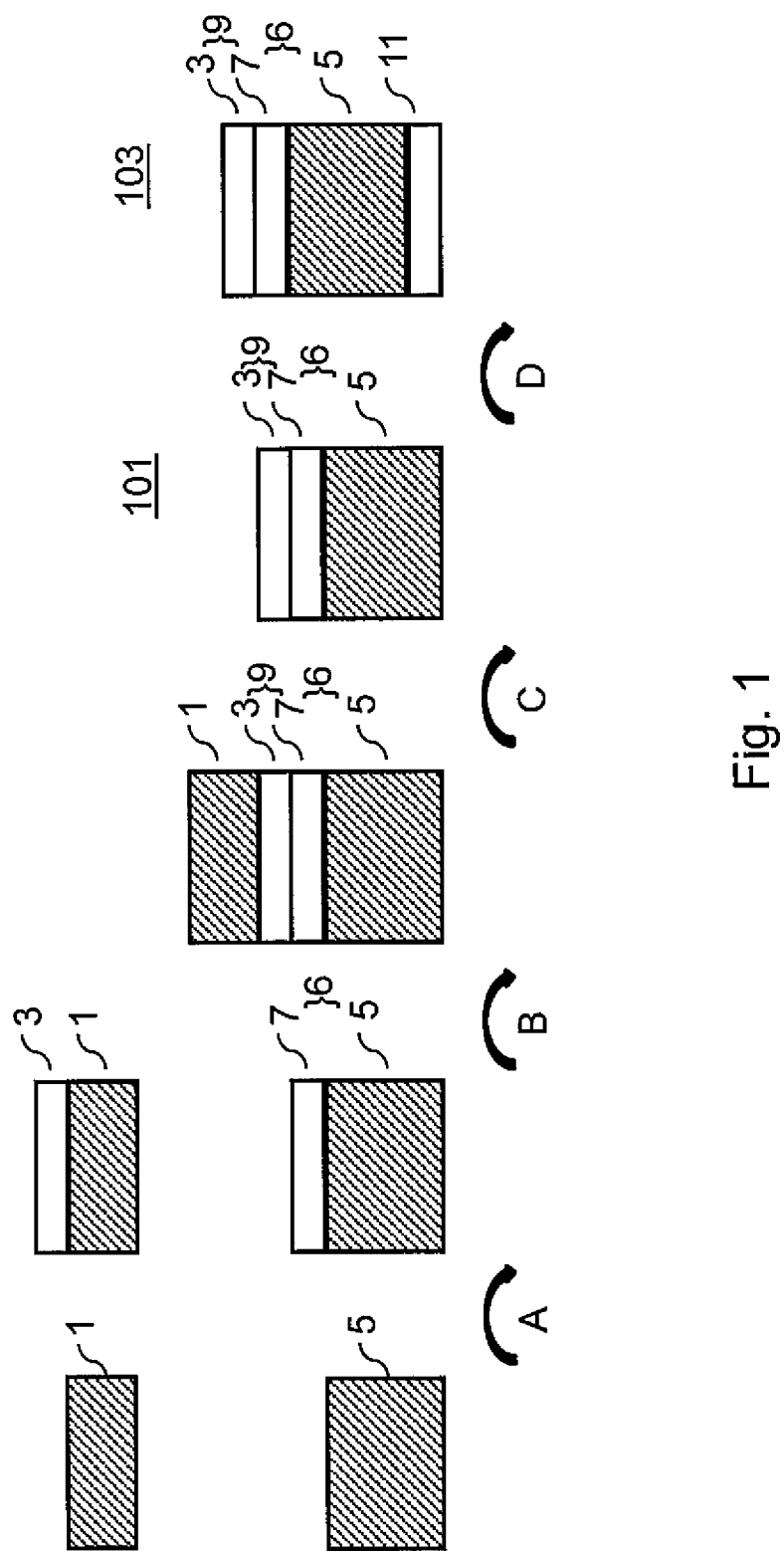
FIG. 1: Schematic drawing of one embodiment.

FIG. 1 shows an example of the method of manufacturing an engineered substrate according to this disclosure.

In a first step, in the leftmost part of FIG. 1, it is indicated that a base substrate 5, hereinafter referred to as "base," is provided. Furthermore, a first substrate 1 is provided. The first substrate 1 serves as an auxiliary substrate, which, however, may be removed or sacrificed before the final engineered substrate is ready.

In a next step, as indicated by the arrow A, a seed layer 3 is formed on the first substrate 1. The seed layer 3 may be of a first semiconductor material. The first semiconductor material may be, e.g., InP or it may be a ternary or quaternary or penternary III-V material, for example, InGaAs or InGaAsP.

Furthermore, a surface layer 7 is formed on the base 5. The surface layer 7 is epitaxially grown on a first side of the base 5. The base 5 and the surface layer 7 are made of a second semiconductor material. Typically the second semiconductor material is GaAs or Ge. The base 5 and surface layer 7 together form a support substrate 6.

No correlation in time between forming the two parts or structures, i.e., the part comprising the seed layer formed on the first substrate and the part comprising the surface layer 7 being provided on the base 5 by epitaxial growth, is required, other than both are available at the beginning of the next step, which is indicated by an arrow B.

As illustrated in FIG. 1, in a next step indicated by B, the two structures are bonded together. That is, the structure comprising the first substrate 1 and the seed layer 3 is bonded together with the second structure comprising the base 5 and the surface layer 7, i.e., the support substrate. The seed layer 3 and the surface layer 7 then form a direct bonding interface 9 between the seed layer 3 and the surface layer 7. Typically, the bonding is performed by direct bonding of the two structures. Direct bonding typically represents molecular adhesion between the two surfaces involved, without using any further bonding layers. Molecular adhesion is typically performed under partial vacuum.

Subsequently, in step C, the first substrate 1 is removed/detached from the seed layer 3, resulting in an engineered substrate 101. Removal of the first substrate may be performed in various ways. Notably, grinding and/or back etching may be used to remove the first substrate 1, thereby eventually exposing the seed layer 3. If this treatment is chosen, the bonding process performed in the step before may be conducted at higher temperatures, e.g., temperatures in a range of 400° C.-600° C., or more preferably between 450° C. and 550° C. Another possibility may be performing the transfer of the first structure onto the second structure prior to bonding by means of SMART CUT®, i.e., introducing an ion implantation step before bonding and then splitting/detaching, cf. FIG. 2. For this possibility, the bonding process should be carried out at a lower temperature, preferably less than 200° C.

Subsequently, in step D, an additional back side metal contact 11 may be provided on a second side of the base 5 opposite to the first side, thereby resulting in an engineered substrate 103. The engineered substrate 103 may be substantially the same as the engineered substrate 101, except for having the additional back side metal contact. Step D and thus providing the additional back side metal contact 11 are optional, but may further improve the efficiency of the engineered substrate 103, and ultimately a solar cell including the engineered substrate. The back side metal contact 11 may serve as a mirror, i.e., its purpose is to reflect such photons that have not yet been converted back toward the active layer of the solar cell. The back side metal contact 11 may also serve for providing an electrical contact to the back side of a solar cell, e.g., contacting a conductive plate in order to avoid complex wiring.

Figure 2:
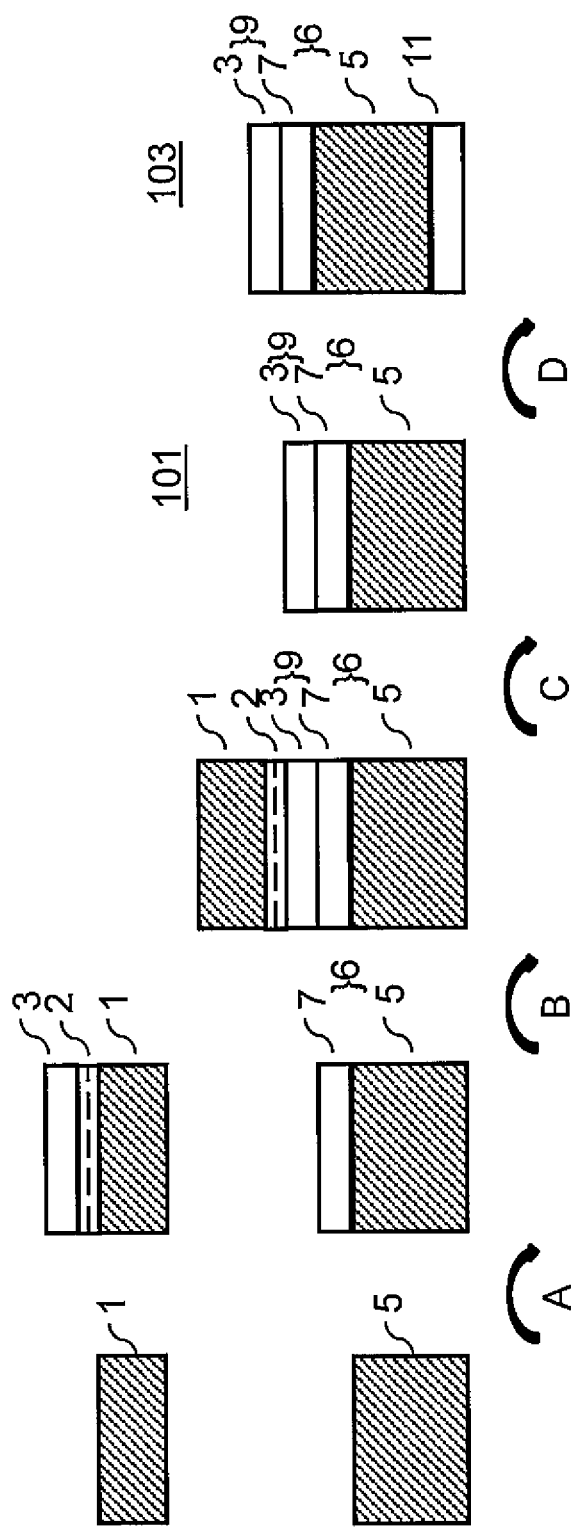
FIG. 2: A modification of the embodiment shown in FIG. 1.

FIG. 2 shows a modification of the embodiment of FIG. 1, however, sharing the same major steps A, B, C and optional step D. The same elements are denoted by the same reference numbers and will not be explained again. In FIG. 2, the first substrate comprises a zipper layer 2 that is provided at the surface of the first substrate 1, representing the contact to the seed layer 3. For example, the zipper layer 2 may be provided in the form of a weakened layer formed by the implantation of ionic species. The ionic species may be, for example, hydrogen or helium ions. In this case, the first substrate 1 can be provided as a bulk substrate, such as an InP substrate, then the implantation through the top surface of the bulk substrate forms the weakened layer 2. The weakened layer or zipper layer 2 thus separates the seed layer 3 and the first substrate 1, respectively, in the top portion and the bottom portion of the bulk substrate. Subsequently, the first substrate 1 is detached from the seed layer 3 by means of the zipper layer 2, for example, the first engineered substrate 101 is cleaved at the zipper layer 2 allowing the detachment of first substrate 1 from the seed layer 3. Then, the further process of detachment of the first substrate 1 may be mediated by the application of mechanical forces to delaminate at the weakened layer 2 formed by hydrogen or helium ions.

The resulting engineered substrates 101 and 103, the latter including a back side metal contact 11, are substantially the same as in FIG. 1. Interface resistivity between directly bonded InP and GaAs depends on the doping concentration and high doping concentrations are necessary to keep such resistivity low. High doping concentrations, however, for GaAs, also lead to strong absorption of light. Thus, only the GaAs substrate should remain sufficiently transparent. For both the engineered substrates 101 and 103 of either embodiment of FIG. 1 as well as FIG. 2, doping concentration of the surface layer 7 is higher than a predetermined value such that the electrical resistivity at the direct bonding interface 9 is below 10 mOhm·cm$^2$, preferentially below 1 mOhm·cm$^2$. Similarly, doping concentration of the base 5, as well as the thickness of the engineered substrates 101, 103, are such that absorption of the engineered substrates 101, 103 is less than 20%, preferentially less than 10%, and total area-normalized series resistance of the engineered substrate 101, 103 is less than 10 mOhm·cm$^2$, preferentially less than 5 mOhm·cm$^2$. The predetermined value for doping concentration typically is $10^{18}$ atoms/cm$^3$. The seed layer 3 of the embodiments shown in FIGS. 1 and 2 has a doping concentration higher than the predetermined value. The thickness of the seed layer 3 and/or the surface layer 7 typically is in a range of 150 nm up to 1 µm. Furthermore, the thickness of the base 5 may range from 100 µm up to 500 µm. The doping concentration of the base 5 typically ranges from $1 \times 10^{14}$-$5 \times 10^{17}$ atoms/cm$^3$. The first semiconductor material typically has a lattice constant in the range of 5.8-6 Å (0.58 nm-0.6 nm).

Each of the engineered substrates 101 and 103 may be used in forming an MJ solar cell. The advantage is that materials of the various junctions may be tuned in order to better match the solar spectrum.

The invention claimed is:
1. An engineered substrate comprising:
a seed layer made of a first semiconductor material for growth of a solar cell;
a support substrate comprising a base and a surface layer epitaxially grown on a first side of the base, the base and the surface layer made of a second semiconductor material, wherein the second semiconductor material is primarily composed of doped or undoped Ge;
a direct bonding interface formed under partial vacuum between the seed layer and the surface layer, wherein the crystal lattice of the seed layer does not match the crystal lattice of the surface layer;
wherein a doping concentration of the surface layer is higher than a predetermined value such that the electrical resistivity at the direct bonding interface is below 10 mOhm·cm$^2$; and
wherein a doping concentration of the base is below the predetermined value, and the doping concentration of the base and the thickness of the engineered substrate are such that absorption of the engineered substrate is less than 20%, and a total area-normalized series resistance of the engineered substrate is less than 10 mOhm·cm$^2$.

2. The engineered substrate of claim 1, further comprising a back side metal contact on a second side of the base opposite to the first side, the back side metal contact serving as a mirror.

3. The engineered substrate of claim 1, wherein the predetermined value is $10^{18}$ atoms/cm$^3$.

4. The engineered substrate of claim 1, wherein the seed layer has a doping concentration higher than the predetermined value.

5. The engineered substrate of claim 1, wherein the thickness of the seed layer and/or the surface layer is in a range extending from 150 nm to 1 µm.

6. The engineered substrate of claim 1, wherein the thickness of the base is in a range extending from 100 µm to 500 µm, and wherein the doping concentration of the base ranges from $1\times10^{14}$-$5\times10^{17}$ atoms/cm$^3$.

7. The engineered substrate of claim 1, wherein the first semiconductor material has a lattice constant in a range extending from 5.8 Å to 6 Å.

8. The engineered substrate of claim 1, wherein the first semiconductor material is InP or the first semiconductor material is a ternary or quaternary or pentenary III-V material.

9. A solar cell comprising an engineered substrate according to claim 1.

10. A method of manufacturing an engineered substrate, comprising:
providing a first substrate;
providing a seed layer on the first substrate, the seed layer made of a first semiconductor material;
providing a base substrate;
forming, by epitaxial growth, a surface layer on a first side of the base substrate, the base substrate and the surface layer made of a second semiconductor material, wherein the second semiconductor material is primarily composed of doped or undoped Ge;
directly bonding the seed layer to the surface layer under partial vacuum, thereby providing a direct bonding interface, wherein the crystal lattice of the seed layer does not match the crystal lattice of the surface layer; and
removing the first substrate;
wherein a doping concentration of the surface layer is higher than a predetermined value such that the electrical resistivity at the direct bonding interface is below 10 mOhm·cm$^2$; and
wherein doping concentration of the base substrate is below the predetermined value, and the doping concentration of the base and the thickness of the engineered substrate are such that both absorption of the engineered substrate is less than 20%, as well as total area-normalized series resistance of the engineered substrate is less than 10 mOhm·cm$^2$.

11. The method of claim 10, further comprising a step of providing a back side metal contact on a second side of the base substrate, the back side metal contact serving as a mirror under the base substrate.

12. The method of claim 10, further comprising:
an ion implantation step for creating an implantation layer in a part of the first substrate and/or the seed layer before directly bonding the seed layer to the surface layer.

13. The engineered substrate of claim 1, wherein the electrical resistivity at the direct bonding interface is below 1 mOhm·cm$^2$.

14. The engineered substrate of claim 1, wherein absorption of the engineered substrate is less than 10%.

15. The engineered substrate of claim 1, wherein the total area-normalized series resistance of the engineered substrate is less than 5 mOhm·cm$^2$.

16. The engineered substrate of claim 8, wherein the first semiconductor material is InGaAs or InGaAsP.

17. The method of claim 10, wherein the electrical resistivity at the direct bonding interface is below 1 mOhm·cm$^2$.

18. The method of claim 10, wherein absorption of the engineered substrate is less than 10%.

19. The method of claim 10, wherein the total area-normalized series resistance of the engineered substrate is less than 5 mOhm·cm$^2$.

* * * * *